United States Patent
Otsubo et al.

(10) Patent No.: US 10,418,168 B2
(45) Date of Patent: Sep. 17, 2019

(54) INDUCTOR AND METHOD FOR MANUFACTURING THE SAME

(71) Applicant: Murata Manufacturing Co., Ltd., Kyoto (JP)

(72) Inventors: Yoshihito Otsubo, Kyoto (JP); Mitsuyoshi Nishide, Kyoto (JP); Norio Sakai, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/998,734

(22) Filed: Aug. 16, 2018

(65) Prior Publication Data

US 2018/0366258 A1    Dec. 20, 2018

Related U.S. Application Data

(63) Continuation of application No. PCT/JP2016/078772, filed on Sep. 29, 2016.

(30) Foreign Application Priority Data

Feb. 16, 2016   (JP) .................................. 2016-026777

(51) Int. Cl.
*H05K 1/00*         (2006.01)
*H01F 27/29*        (2006.01)
(Continued)

(52) U.S. Cl.
CPC ......... *H01F 27/29* (2013.01); *H01F 17/0033* (2013.01); *H01F 27/24* (2013.01);
(Continued)

(58) Field of Classification Search
CPC .......... H01F 27/29; H01F 17/04; H01F 27/24; H01F 27/28; H01F 41/04; H05K 1/185;
(Continued)

(56) References Cited

U.S. PATENT DOCUMENTS 5,612,660 A * 3/1997 Takimoto ............ H01F 17/0013
                                            336/200
7,443,362 B2* 10/2008 Yungers ............. G06K 7/10316
                                            343/702
2014/0218147 A1    8/2014 Chatani et al.

FOREIGN PATENT DOCUMENTS

JP    H07-320969 A    12/1995
JP    H08-97036 A      4/1996
(Continued)

OTHER PUBLICATIONS

International Search Report for International Application No. PCT/JP2016/078772, dated Dec. 27, 2016.
(Continued)

*Primary Examiner* — Pete T Lee
(74) *Attorney, Agent, or Firm* — Pearne & Gordon LLP

(57) ABSTRACT

A small-sized inductor with desired characteristics is provided. An inductor 1a includes a resin layer 3 and an inductor electrode 6, which includes an inner winding portion 6a and an outer winding portion 6b. The inner winding portion 6a and the outer winding portion 6b forming the inductor electrode 6 include the metal pins 7a to 7d and the wiring boards 8a to 8d. Here, the inner winding portion 6a and the outer winding portion 6b include the metal pins 7a to 7d and the wiring boards 8a to 8d, which have lower specific resistance than conductive paste or plating. This structure thus can reduce the resistance of the entirety of the inductor electrode 6, and improve the characteristics of the inductor 1a. The inductor 1a can reduce its size by including the inductor electrode 6 wound to have a multiplex winding structure.

19 Claims, 11 Drawing Sheets

(51) Int. Cl.
   *H01F 41/04*      (2006.01)
   *H01F 27/24*      (2006.01)
   *H01F 27/28*      (2006.01)
   *H05K 1/18*       (2006.01)
   *H05K 3/30*       (2006.01)
   *H01F 17/00*      (2006.01)
   *H05K 1/16*       (2006.01)

(52) U.S. Cl.
   CPC ............. *H01F 27/28* (2013.01); *H01F 41/04* (2013.01); *H05K 1/165* (2013.01); *H05K 1/185* (2013.01); *H05K 3/30* (2013.01); *H05K 2201/1003* (2013.01); *H05K 2203/1305* (2013.01)

(58) Field of Classification Search
   CPC ............. H05K 3/30; H05K 2201/1003; H05K 2203/1305
   See application file for complete search history.

(56) References Cited

FOREIGN PATENT DOCUMENTS

| | | |
|---|---|---|
| JP | 2000-040620 A | 2/2000 |
| JP | 2013-258393 A | 12/2013 |
| JP | 5474251 B1 | 4/2014 |

OTHER PUBLICATIONS

Written Opinion for International Application No. PCT/JP2016/078772, dated Dec. 27, 2016.

\* cited by examiner

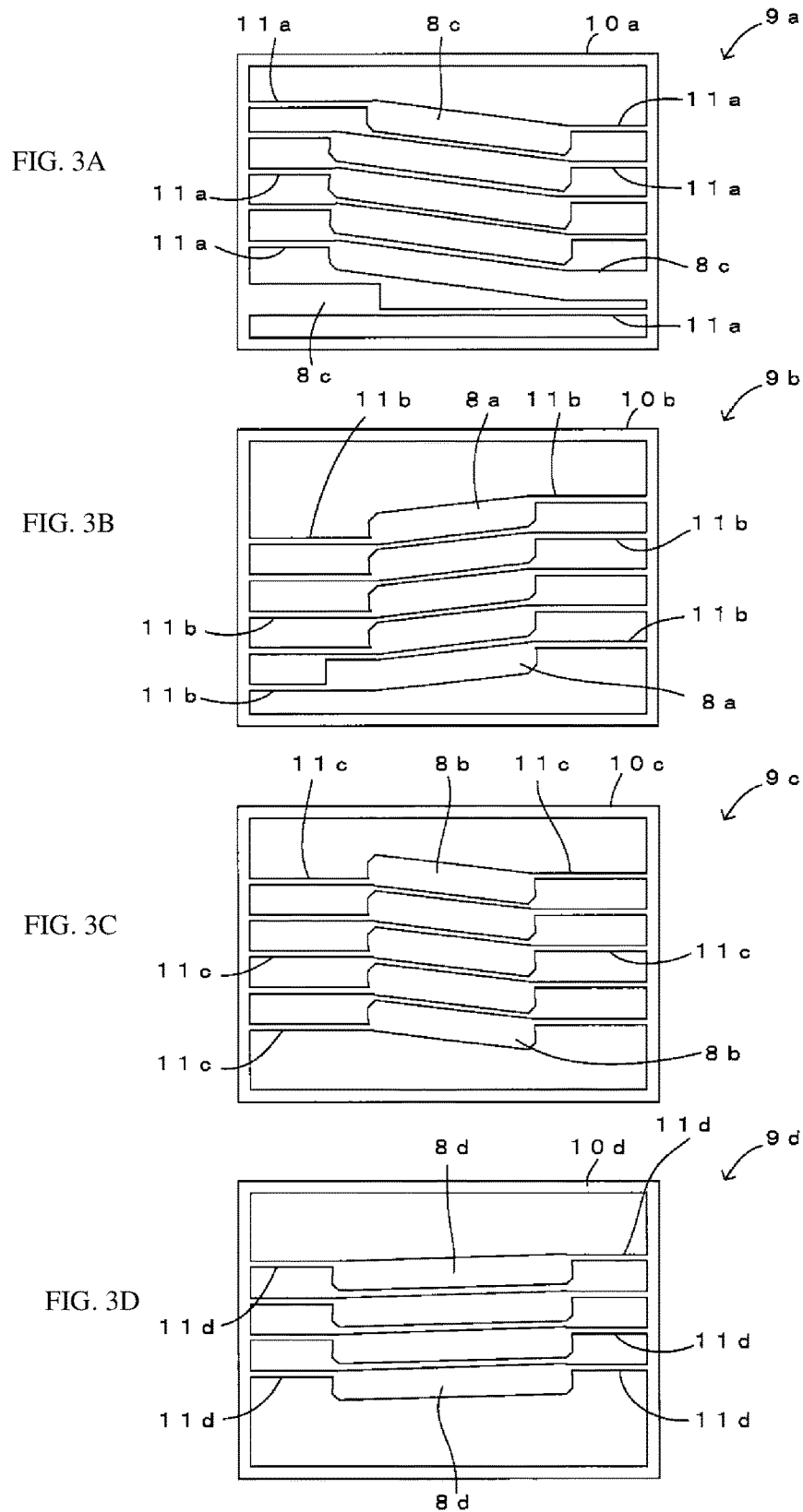

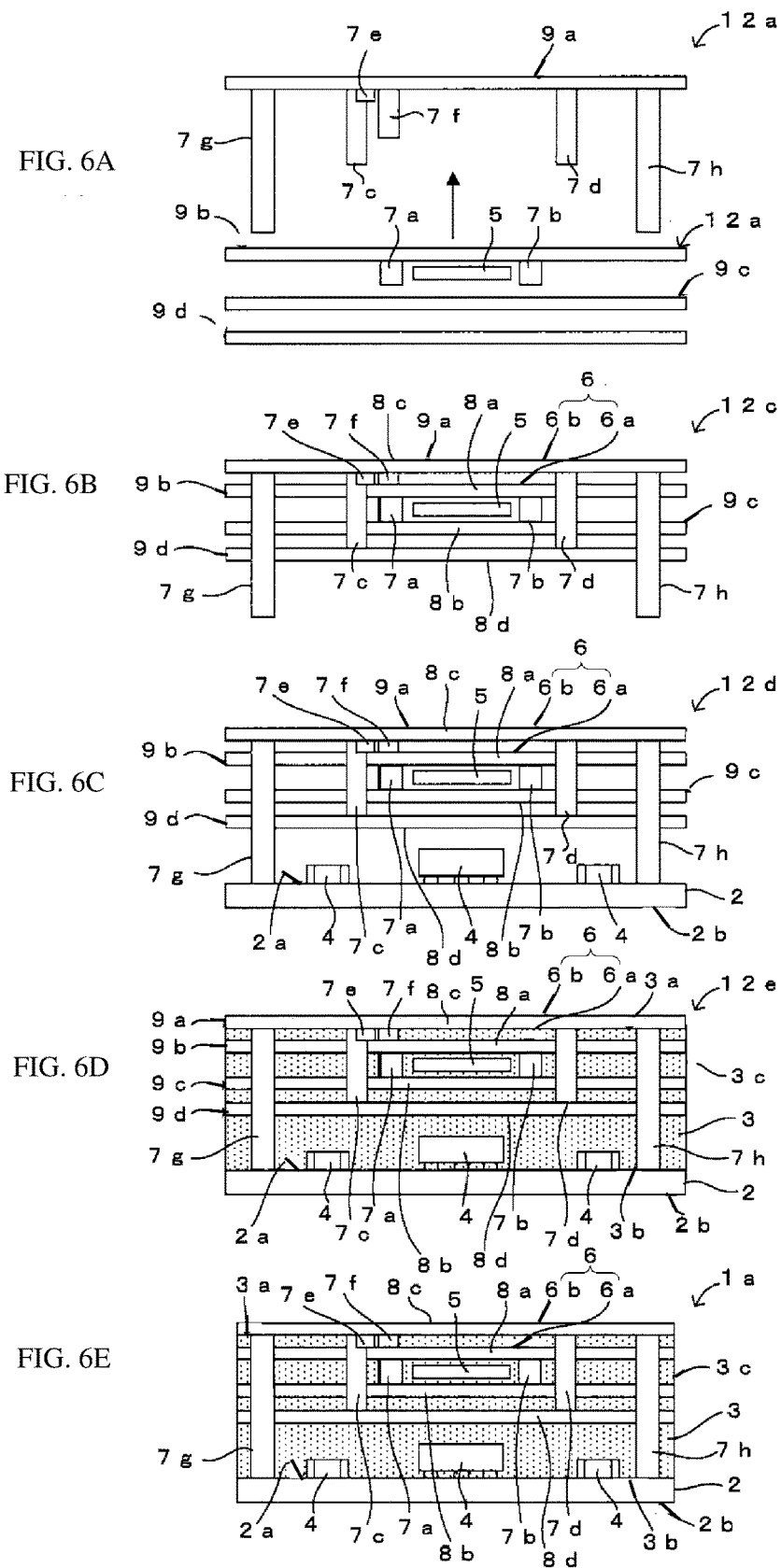

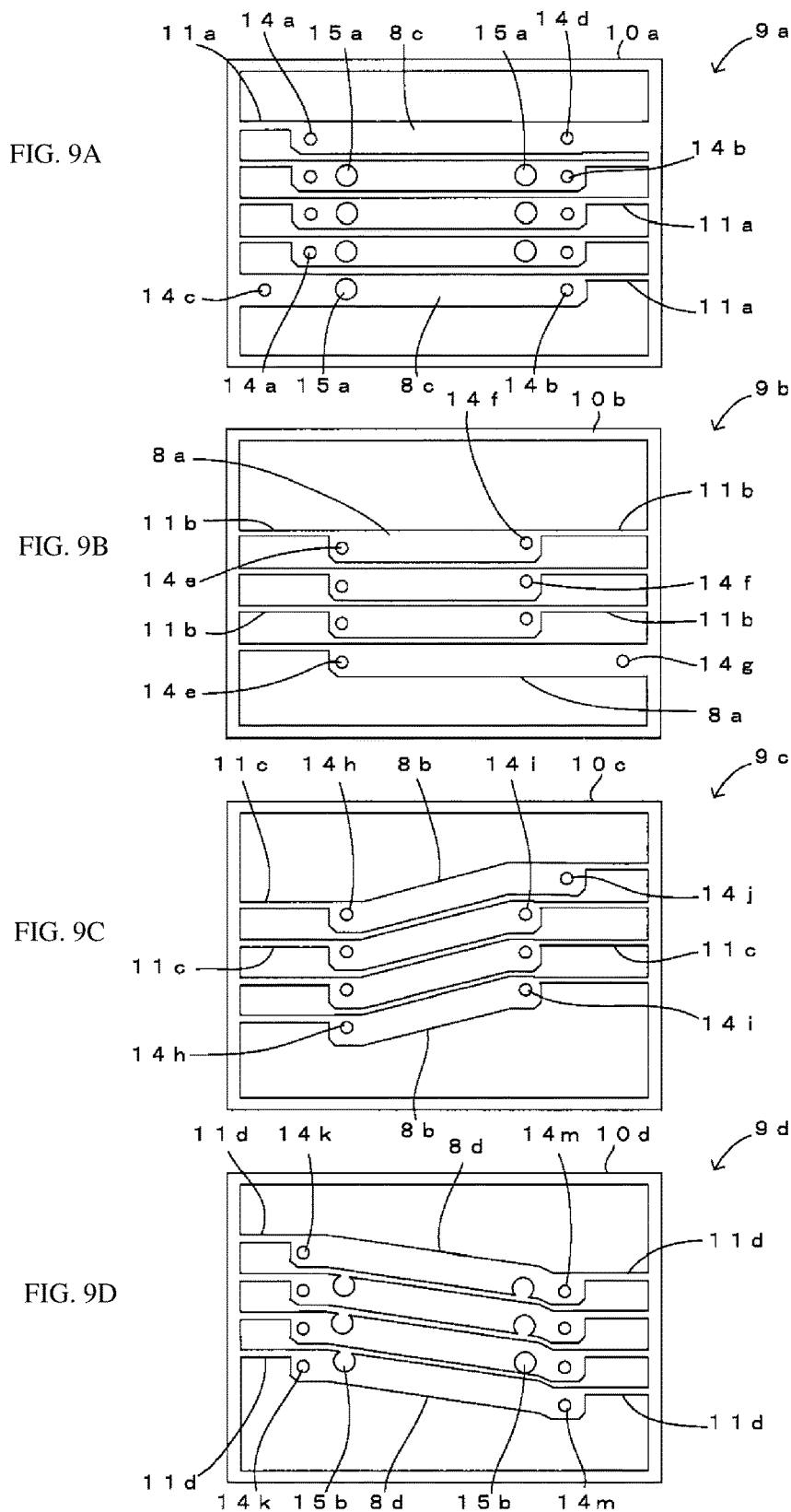

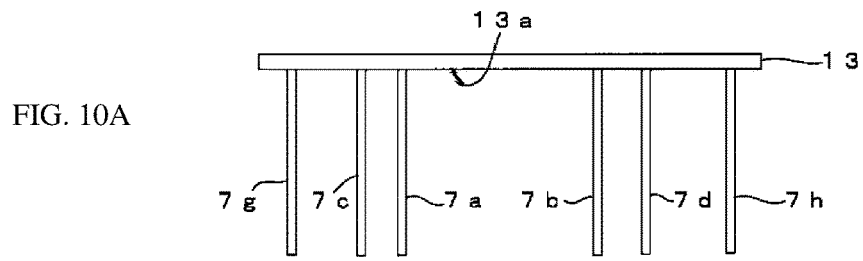
FIG. 10A
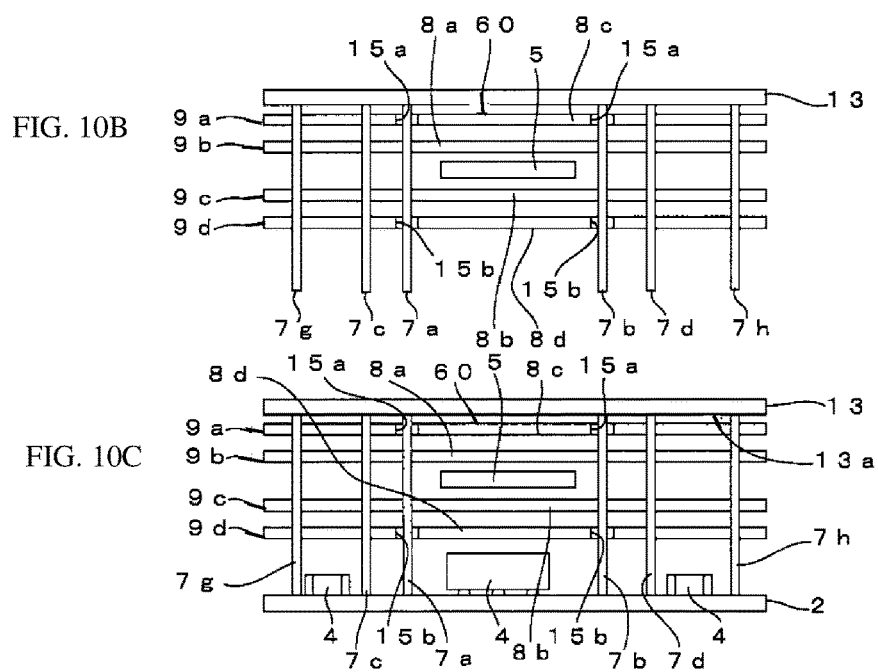
FIG. 10B
FIG. 10C
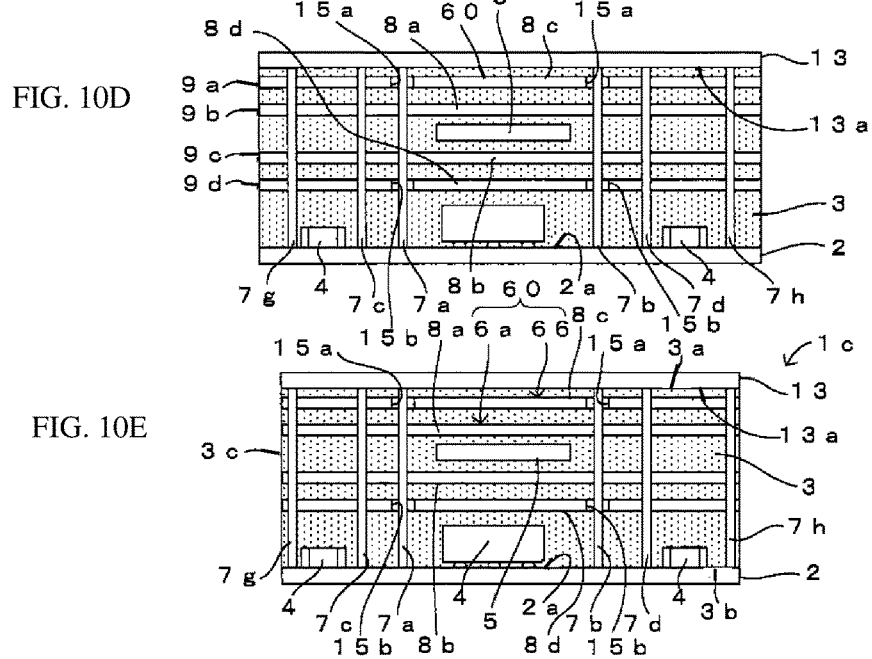
FIG. 10D
FIG. 10E

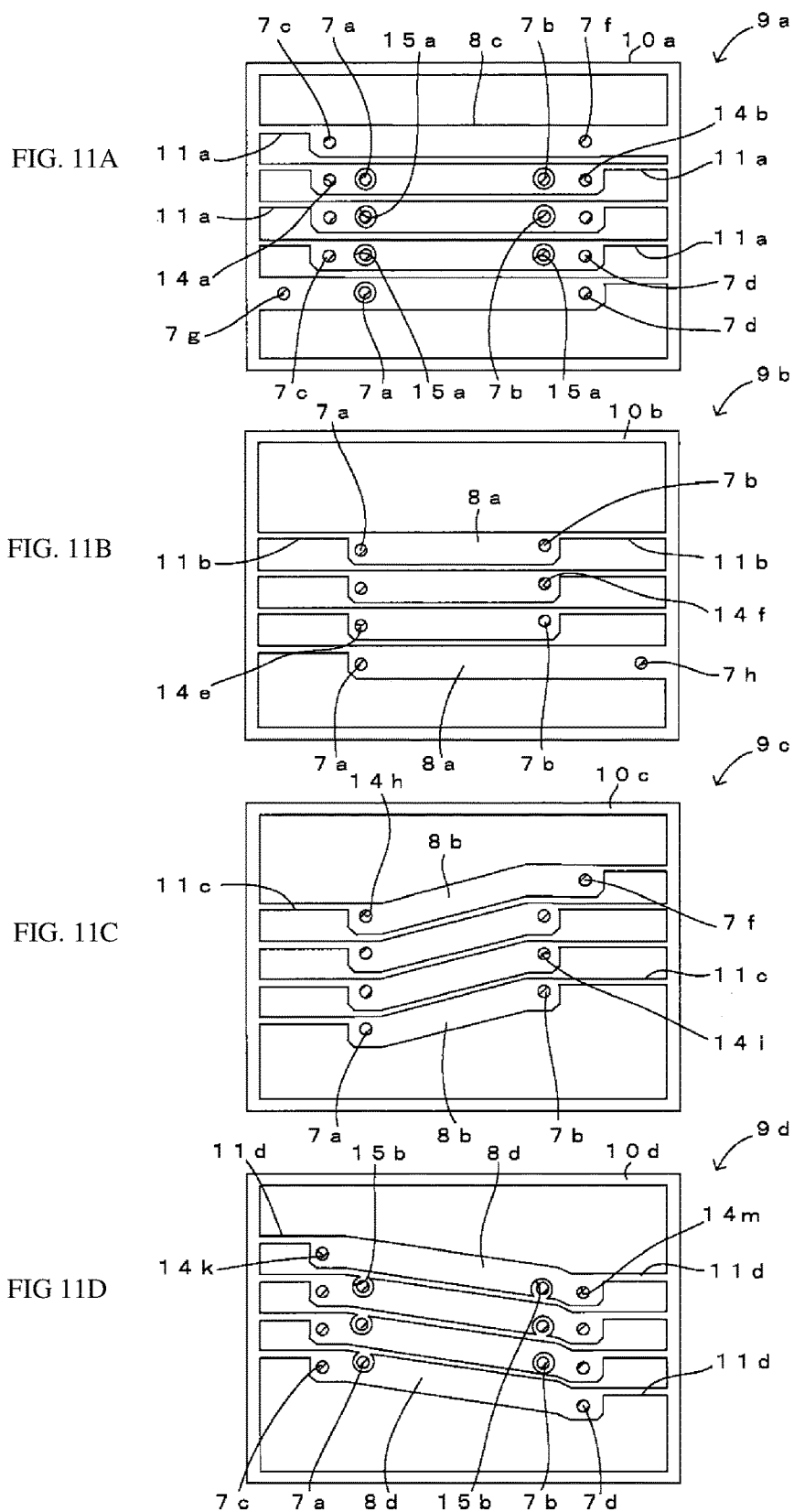

INDUCTOR AND METHOD FOR MANUFACTURING THE SAME

This is a continuation of International Application No. PCT/JP2016/078772 filed on Sep. 29, 2016 which claims priority from Japanese Patent Application No. 2016-026777 filed on Feb. 16, 2016. The contents of these applications are incorporated herein by reference in their entireties.

BACKGROUND OF THE DISCLOSURE

Field of the Disclosure

The present disclosure relates to an inductor including a resin layer and an inductor electrode, and a method for manufacturing the same.

Description of the Related Art

An inductor 100, illustrated in FIG. 14, including a coil 102 in a core substrate 101 formed from a printed circuit board or a prepreg is known (see, for example, Patent Document 1). In this case, an annular magnetic layer 103 is disposed in the core substrate 101, and the coil 102 is helically wound around the magnetic layer 103. The coil 102 includes multiple internal interlayer connection conductors 102a, arranged along the inner periphery of the magnetic layer 103, multiple external interlayer connection conductors 102b, arranged along the outer periphery of the magnetic layer 103 to form multiple pairs with the respective internal interlayer connection conductors 102a, multiple upper wiring patterns 102c, which each connects the upper ends of the predetermined ones of the internal interlayer connection conductors 102a and the external interlayer connection conductors 102b to each other, and multiple lower wiring patterns 102d, which each connects the lower ends of the predetermined ones of the internal interlayer connection conductors and the external interlayer connection conductors 102b to each other. Here, all the interlayer connection conductors 102a and 102b are formed from through hole conductors, which are conductor films disposed on the inner surfaces of through holes extending through the core substrate 101. All the wiring patterns 102c and 102d are formed from printed patterns using conductive paste.

Patent Document 1: Japanese Unexamined Patent Application Publication No. 2000-40620 (see, for example, paragraph 0018 and FIG. 1)

BRIEF SUMMARY OF THE DISCLOSURE

Size reduction and enhancement of multifunctionality of electronic devices in these years demand size reduction and enhancement of multifunctionality of inductors mounted on such electronic devices. One way to improve the characteristics of the inductors is to reduce the resistance of the inductor electrode (coil 102 in the above inductor 100). However, in the existing inductor 100, both interlayer connection conductors 102a and 102b constituting the coil 102 are formed from through hole conductors formed from conductor films disposed on the inner surfaces of the through holes, and the reducible connection resistance between the upper wiring patterns 102c and the lower wiring patterns 102d is limited. The connection resistance would be reduced if the through holes are filled with conductive paste to be formed into via conductors. However, conductive paste, which is generally formed by mixing a metal filler into an organic solvent or the like, includes voids or gaps in the metal area, and thus has higher specific resistance than pure metal. Similarly, the wiring patterns 102c and 102d are formed from conductive paste. Reducing the resistance of the entire inductor electrode is thus difficult. Another method conceivable to improve the characteristics of inductors is to increase the number of windings of the coil 102. Increasing the number of windings of the coil 102 in the existing inductor 100 would require larger spaces on the main surfaces (upper surface and lower surface) of the core substrate 101 to allow additional upper wiring patterns 102c and lower wiring patterns 102d to be formed thereon. This structure thus may fail to fulfill both size reduction and enhancement of multifunctionality of the inductor 100.

The present disclosure is made to address the above problem and aims to provide a small-sized inductor with desired characteristics.

In order to attain the above object, an inductor according to the present disclosure includes a resin layer having a main surface; and an inductor electrode wound around a winding axis set in the resin layer. The inductor electrode includes an inner winding portion and an outer winding portion. The inner winding portion includes a plurality of wiring first metal boards, a plurality of wiring second metal boards, a plurality of first metal pins, and a plurality of second metal pins. The plurality of wiring first metal boards have first ends disposed at one side of the winding axis and second ends disposed at another side of the winding axis when viewed in a direction perpendicular to the main surface. The plurality of wiring first metal boards are arranged in a winding axis direction at a first side of the winding axis in the direction perpendicular to the main surface. The plurality of wiring second metal boards have first ends disposed at one side of the winding axis and second ends disposed at another side of the winding axis when viewed in the direction perpendicular to the main surface. The plurality of wiring second metal boards are arranged in the winding axis direction at a second side of the winding axis in the direction perpendicular to the main surface to form a plurality of pairs with the respective first metal boards. The plurality of first metal pins connect the first ends of the first metal boards to the first ends of the second metal boards paired with the first metal boards. The plurality of second metal pins each connect the second end of one of the first metal boards to the second end of one of the second metal boards adjacent to the second metal board paired with the first metal board. The outer winding portion includes a plurality of wiring third metal boards, a plurality of wiring fourth metal boards, a plurality of third metal pins, and a plurality of fourth metal pins. The plurality of wiring third metal boards have first ends disposed at one side of the winding axis and second ends disposed at another side of the winding axis when viewed in the direction perpendicular to the main surface. The plurality of wiring third metal boards are arranged in the winding axis direction at the first side of the winding axis in the direction perpendicular to the main surface and at positions apart from the winding axis further than the first metal boards. The plurality of wiring fourth metal boards have first ends disposed at one side of the winding axis and second ends disposed at another side of the winding axis when viewed in the direction perpendicular to the main surface. The plurality of wiring fourth metal boards are arranged in the winding axis direction at the second side of the winding axis in the direction perpendicular to the main surface and at positions apart from the winding axis further than the second metal boards to form a plurality of pairs with the respective third metal boards. The plurality of third metal pins connect the first ends of the third metal boards to the first ends of the fourth metal boards paired with the third metal boards. The plurality of fourth metal pins each connect the second end of one of the third metal boards to the second end of one of the fourth metal boards adjacent to the fourth metal board paired with the third metal board.

In this structure, the inductor electrode includes the first to fourth metal pins and the first to fourth metal boards, which have lower specific resistance than conductive paste or plating. This structure can thus reduce the resistance of the entirety of the inductor electrode, and improve the characteristics (such as inductance) of the inductor. The inductor electrode has a three-dimensional wiring structure (multiplex winding structure) including the inner winding portion and the outer winding portion. Thus, the inductor electrode can easily increase the number of windings further than in the case where the first metal boards and the third metal boards are disposed in the same plane. Specifically, a small-sized inductor with desired characteristics (such as inductance) can be provided. In addition, a small-sized inductor with desired characteristics can be manufactured at low costs without the need for forming through hole conductors or via conductors included in an existing structure.

The first metal pins and the second metal pins may extend through the first metal boards and the second metal boards to which the pins are connected, and have a length reaching the third metal boards and the fourth metal boards. The third metal boards and the fourth metal boards may have insertion holes for prevention of contact with the first metal pins and the second metal pins. This structure achieves an inductor electrode with a multiplex winding structure without changing the length of the metal pins of the inner winding portion and the length of the metal pins of the outer winding portion from each other.

The first metal pins, the second metal pins, the third metal pins, and the fourth metal pins may have the same length. Here, an inductor electrode can be formed with the metal pins of the same length. Thus, the inductor can be manufactured at low costs.

The inductor electrode may further include a fifth metal pin serving as an input terminal or an output terminal. The fifth metal pin may be longer than each of the first metal pins, the second metal pins, the third metal pins, and the fourth metal pins. This structure can improve the flexibility of designing the inside of the resin layer using the length of the first to fourth metal pins and the length of the fifth metal pin, such as using an area facing the first main surface of the resin layer as an area for receiving an inductor electrode and using an area facing the second main surface of the resin layer as an area for receiving a component.

The inductor may also include a circuit board having a first main surface in contact with the main surface of the resin layer, and a component mounted on the first main surface and sealed in the resin layer. The first ends of the fifth metal pins may be exposed from the main surface of the resin layer and connected to the circuit board. When, for example, an outer electrode is disposed on the back surface opposite to the main surface of the circuit board and the inductor is mounted on the mother board, this structure enables the component to be located closer to the mother board and thus improves the dissipation of the heat generated from the component. In addition, the size of an inductor can be reduced by disposing the component between the fourth metal boards and the main surface of the circuit board.

When viewed in the direction perpendicular to the main surface, the third metal pins may be arranged along the winding axis at positions apart from the winding axis further than the first metal pins. When viewed in the direction perpendicular to the main surface, the fourth metal pins may be arranged along the winding axis at positions apart from the winding axis further than the second metal pins. This structure prevents the third and fourth metal pins constituting a part of the outer winding portion from interfering with the winding of the inner winding portion.

Electric current flowing through the first metal boards and the third metal boards may flow from the first ends to the second ends. Electric current flowing through the second metal boards and the fourth metal boards may flow from the second ends to the first ends. While electric current flows through the inductor electrode, this structure prevents the magnetic field generated in the inner winding portion and the magnetic field generated in the outer winding portion from cancelling each other. This structure can thus improve the characteristics such as inductance.

The first metal boards, the second metal boards, the third metal boards, and the fourth metal boards may include elongations that reach, when viewed in the direction perpendicular to the main surface, a periphery of the resin layer at the respective first ends and the respective second ends. The inductor with this structure can improve the heat dissipation property with an increase of the metal areas in the inductor. A part of the end portions of the elongations is exposed from the resin layer with both ends of the metal boards reaching the periphery of the resin layer, so that heat stored in the resin layer can be easily dissipated.

A coil core may be disposed on the winding axis. This structure can effectively increase the inductance of the inductor electrode.

A method for manufacturing the inductor according to the present disclosure includes a step of fixing first ends of the first metal pins, the second metal pins, the third metal pins, and the fourth metal pins to a first main surface of a support plate to vertically arrange the metal pins on the first main surface of the support plate; a step of preparing a first plate including the third metal boards and a flat frame supporting the third metal boards, the third metal boards each having an insertion hole having a diameter smaller than each of diameters of the third metal pins and the fourth metal pins that are connected to the third metal boards, a second plate including the first metal boards and a flat frame supporting the first metal boards, the first metal boards each having an insertion hole having a diameter smaller than each of diameters of the first metal pins and the second metal pins that are connected to the first metal boards, a third plate including the second metal boards and a flat frame supporting the second metal boards, the second metal boards each having an insertion hole having a diameter smaller than each of diameters of the first metal pins and the second metal pins that are connected to the second metal boards, and a fourth metal plate including the fourth metal boards and a flat frame supporting the fourth metal boards, the fourth metal boards each having an insertion hole having a diameter smaller than each of diameters of the third metal pins and the fourth metal pins that are connected to the fourth metal boards, and inserting the metal pins into the corresponding insertion holes to arrange and fix the metal pins substantially parallel to each other at predetermined intervals sequentially at the first plate, the second plate, the third plate, and the fourth plate; a step of sealing the first to fourth metal pins and the first to fourth plates with resin to form a resin layer; and a step of removing the flat frames of the first to fourth plates by dicing. The third metal boards and the fourth metal boards have insertion holes having a larger diameter than the metal pins at positions overlapping the first metal pins and the second metal pins when viewed in a direction perpendicular to the first main surface of the support plate.

With this method, an inductor that includes an inductor electrode including metal pins and metal boards having lower specific resistance than conductive paste or plating can be easily manufactured. This structure does not include a filled via as a portion of the inductor electrode, so that an inductor having desired characteristics such as inductance can be manufactured at low costs. To form, in a resin layer, an inductor electrode of a multiplex winding structure including an inner winding portion and an outer winding portion, an existing method involves, for example, forming portions corresponding to first and second metal boards of the inner winding portion on both main surfaces of a first resin layer, and then forming other resin layers between these metal boards and third and fourth metal boards of the outer winding portion. However, a method for manufacturing an inductor according to the present disclosure only requires forming a single resin layer. Forming insertion holes with a large diameter in the third and fourth metal boards constituting a part of the outer winding portion enables appropriate connection of the first and second metal pins to only the corresponding metal boards (first and second metal boards) while the first and second metal pins have the same length as the third and fourth metal pins.

According to the present disclosure, the inductor electrode includes the first to fourth metal pins and the first to fourth metal boards having lower specific resistance than conductive paste or plating, so that the inductor electrode has low resistance as a whole. Thus, the inductor can improve its characteristics (such as inductance). The inductor electrode has a three-dimensional wiring structure (multiplex winding structure) including an inner winding portion and an outer winding portion. Thus, the size of an inductor can be easily reduced further than in the case, for example, where the first metal boards and the third metal boards are disposed in the same plane. This structure does not involve forming of through hole conductors or via conductors as in an existing structure. Thus, a small-sized and highly functional inductor can be provided with low-cost components.

Figure 1:
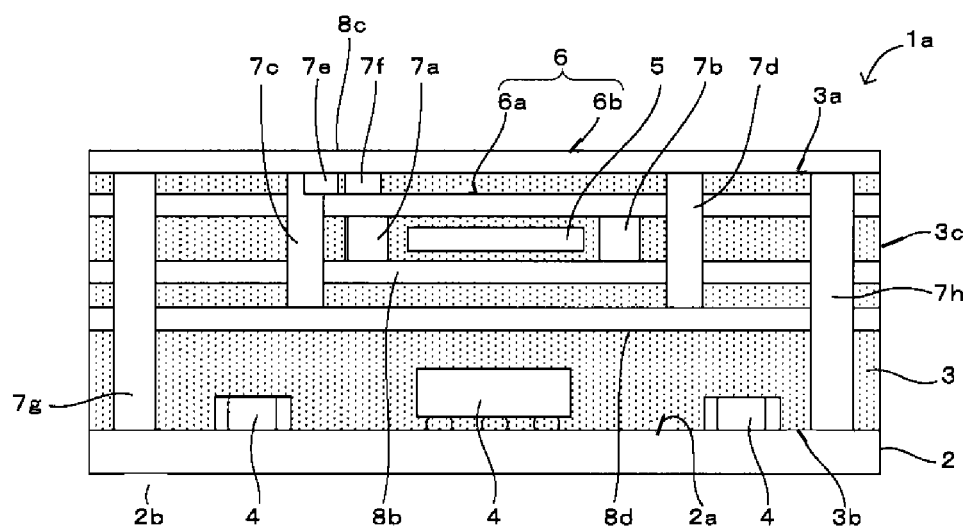
FIG. 1 illustrates an inductor according to a first embodiment of the present disclosure.

Each of FIGS. 3A to 3D is a plan view of a wiring board illustrated in FIG. 1.

Figure 4A:
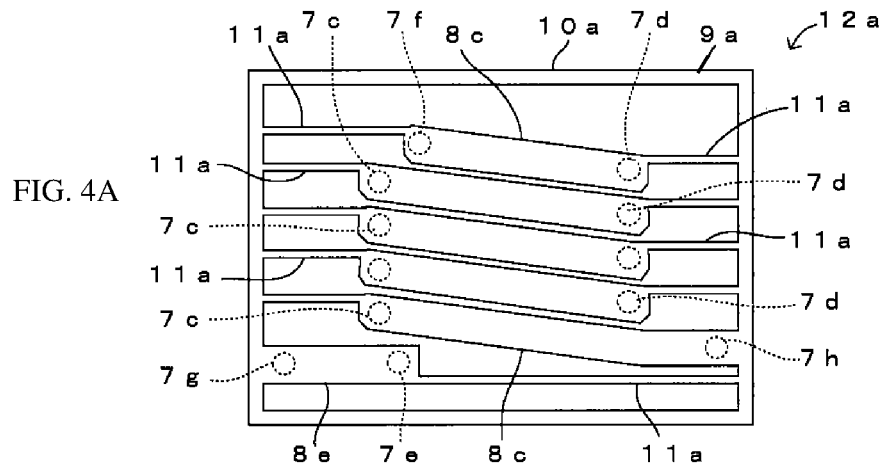
Figure 4B:
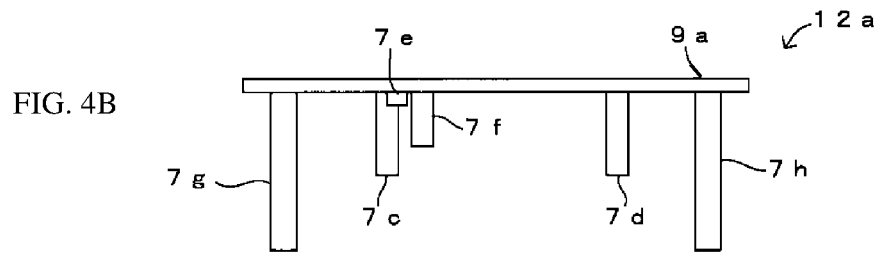

FIGS. 4A and 4B illustrate a method for manufacturing the inductor illustrated in FIG. 1.

Figure 5A:
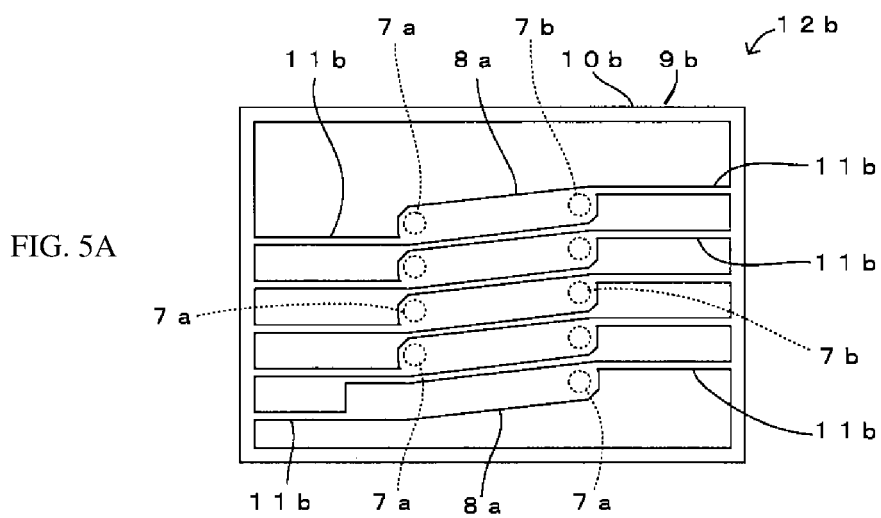
Figure 5B:
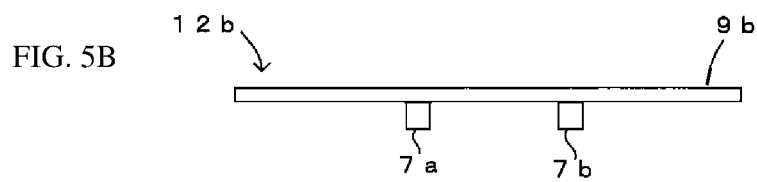

FIGS. 5A and 5B illustrate a process of the method for manufacturing the inductor illustrated in FIG. 1, the process following that in FIGS. 4A and 4B.

FIGS. 6A to 6E illustrate processes of the method for manufacturing the inductor illustrated in FIG. 1, the processes following that in FIGS. 5A and 5B.

Figure 7:
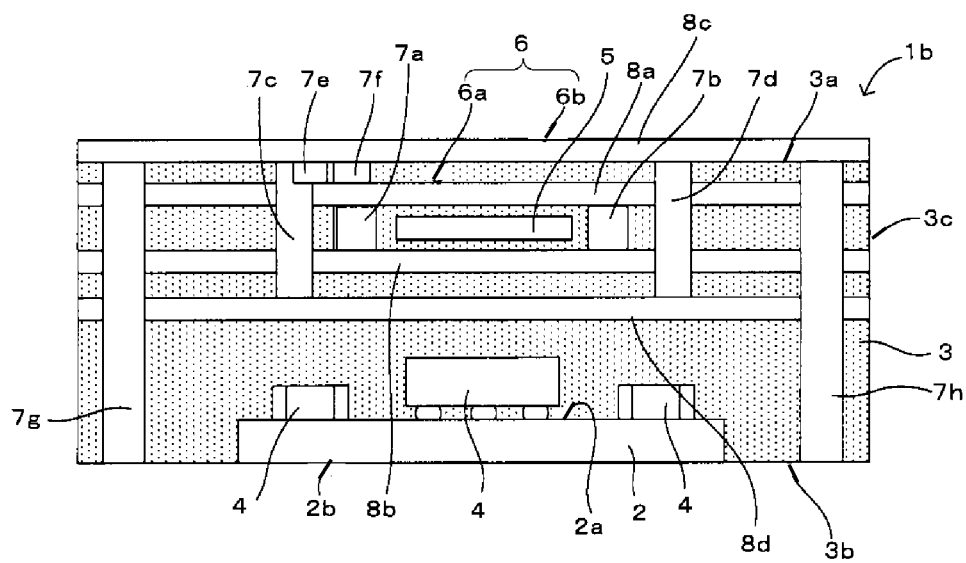

FIG. 7 illustrates an inductor according to a second embodiment of the present disclosure.

Figure 8:
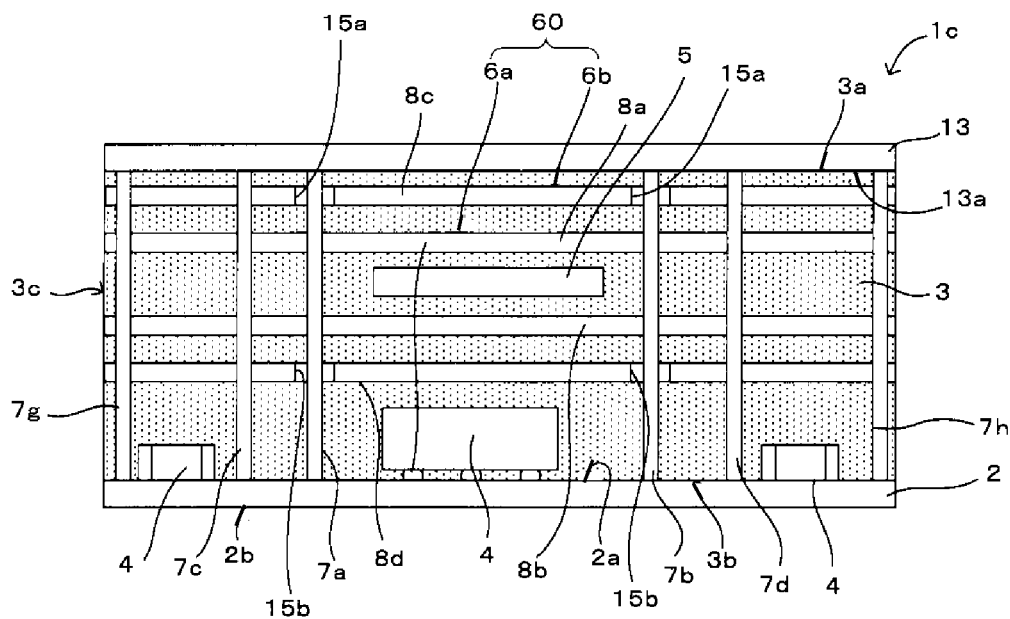

FIG. 8 illustrates an inductor according to a third embodiment of the present disclosure.

Each of FIGS. 9A to 9D is a plan view of a wiring board illustrated in FIG. 8.

FIGS. 10A to 10E illustrate a method for manufacturing the inductor illustrated in FIG. 8.

Each of FIGS. 11A to 11D illustrates the positional relationship between metal pins and wiring boards of the inductor illustrated in FIG. 8.

Figure 12:
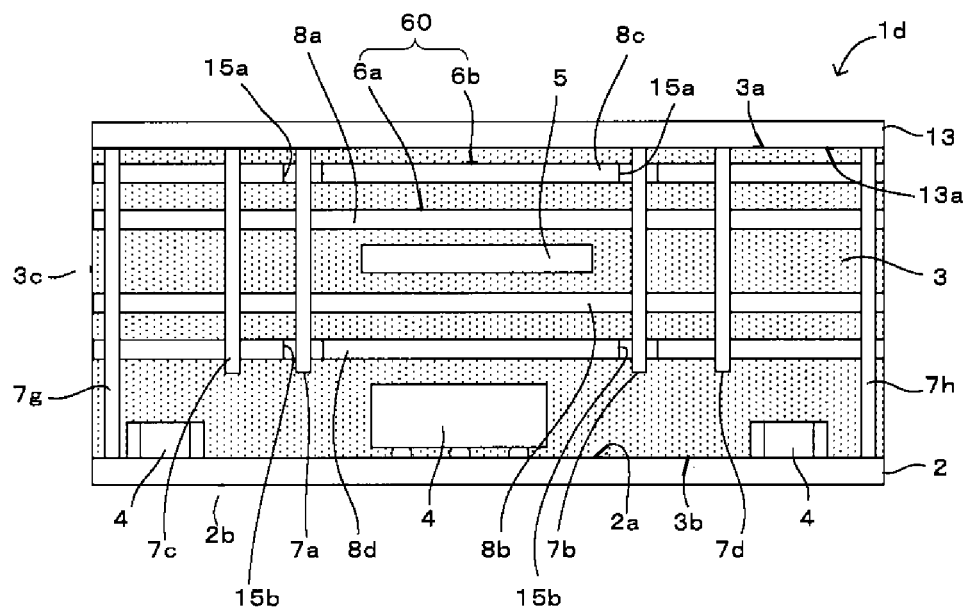

FIG. 12 illustrates an inductor according to a fourth embodiment of the present disclosure.

Figure 13:
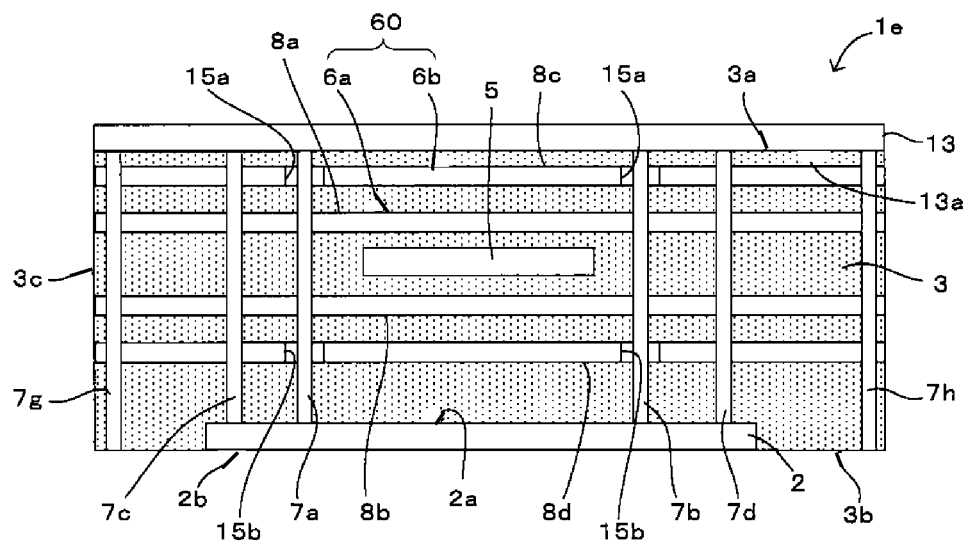

FIG. 13 illustrates an inductor according to a fifth embodiment of the present disclosure.

Figure 14:
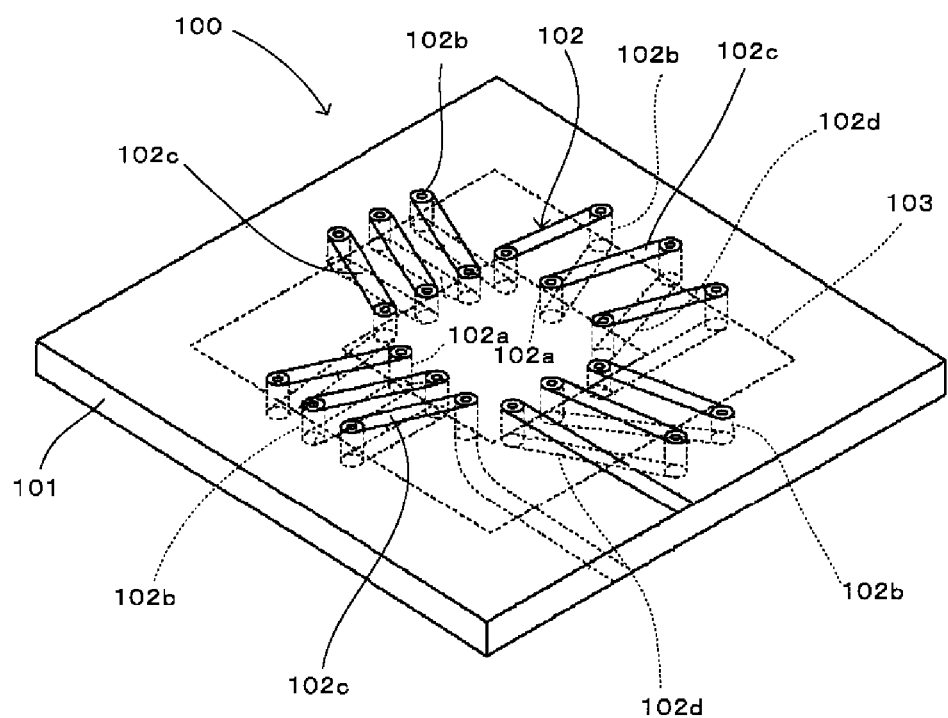

FIG. 14 is a perspective view of an existing inductor.

DETAILED DESCRIPTION OF THE DISCLOSURE

<First Embodiment>

Figure 2:
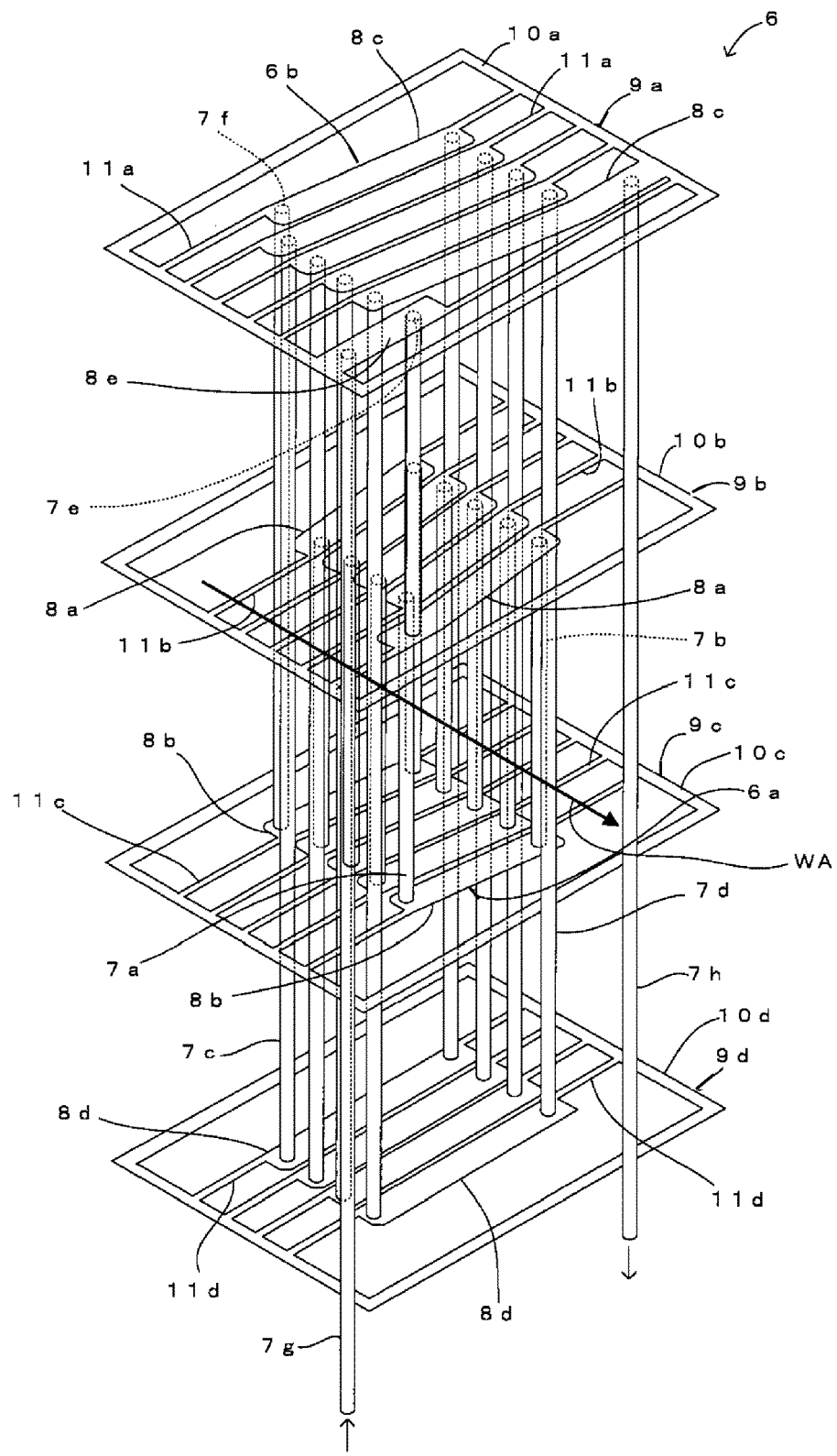
FIG. 2 illustrates an inductor electrode illustrated in FIG. 1.

An inductor according to a first embodiment of the present disclosure is described with reference to FIG. 1 to FIG. 3D. FIG. 1 illustrates the inductor viewed in a direction parallel to the main surface of the circuit board and omits illustration of a part of a resin layer to show the internal structure. FIG. 2 is a perspective view of an inductor electrode and illustrates a wiring structure. FIG. 3A is a plan view of an outer-winding upper wiring board, FIG. 3B is a plan view of an inner-winding upper wiring board, FIG. 3C is a plan view of an inner-winding lower wiring board, and FIG. 3D is a plan view of an outer-winding lower wiring board.

An inductor $1a$ according to the present embodiment includes a circuit board 2, a resin layer 3, laminated on an upper surface $2a$ or a first main surface of the circuit board 2, multiple components 4, mounted on the upper surface $2a$ of the circuit board 2, a coil core 5, disposed inside the resin layer 3, and an inductor electrode 6. The inductor $1a$ is mounted on, for example, a mother board of an electronic device such as a mobile terminal device.

The circuit board 2 is, for example, a glass epoxy resin substrate or a ceramic substrate, and includes via conductors or various types of wiring electrodes. A connection electrode (not illustrated) for connecting with two metal pins $7g$ and $7h$, constituting input/output terminals of each component 4 or the inductor electrode 6, described below, is disposed on the upper surface $2a$. An outer electrode, not illustrated, is disposed on a lower surface $2b$ of the circuit board 2. The circuit board 2 may have either a single-layer structure or a multilayer structure.

Each component 4 is formed from, for example, a semiconductor device made of Si or the like, a chip capacitor, a chip inductor, or a chip resistor. Each component is sealed in the resin layer 3 at a position between the circuit board 2 and outer-winding lower wiring boards $8d$ of the inductor electrode 6.

The resin layer 3 has an upper surface $3a$ on which outer-winding upper wiring boards $8c$ are disposed and an lower surface $3b$ (corresponding to "a main surface of the resin layer" in the present disclosure) in contact with the upper surface $2a$ of the circuit board 2. The resin layer 3 and the circuit board 2 according to the embodiment are rectangular and extend horizontally, when viewed in a direction perpendicular to the upper surface $3a$ of the resin layer 3 (also referred to as being viewed in a plan, below). The resin layer 3 can be made of various materials generally used as a sealing resin such as an epoxy resin.

The coil core 5 is made of a general magnetic material usable for a coil core, such as Mn—Zn ferrite. The coil core 5 is disposed between inner-winding left metal pins $7a$ and inner-winding right metal pins $7b$.

The inductor electrode 6 has a so-called multiplex winding structure, including an inner winding portion $6a$ and an outer winding portion $6b$. The inductor electrode 6 is disposed in the resin layer 3 and winds around a winding axis WA (see FIG. 2) parallel to the main surface (upper surface $3a$ or lower surface $3b$) of the resin layer 3. In this embodiment, the coil core 5 is formed in a rodlike shape. The coil core 5 is disposed on the winding axis WA. In other words, the inductor electrode 6 is disposed to wind around the coil core 5.

With reference to FIG. 2, now, the structure of the inductor electrode 6 and the wiring structure are described. The inner winding portion 6a of the inductor electrode 6 includes multiple inner-winding upper wiring boards 8a (corresponding to "first metal boards" of the present disclosure), multiple inner-winding lower wiring boards 8b (corresponding to "second metal boards" of the present disclosure), multiple inner-winding left metal pins 7a (corresponding to "first metal pins" of the present disclosure), and multiple inner-winding right metal pins 7b (corresponding to "second metal pins").

The inner-winding upper wiring boards 8a are disposed above the coil core 5 (corresponding to "a first side of the winding axis in a direction perpendicular to the main surface" of the present disclosure). When viewed in a plan view, the inner-winding upper wiring boards 8a are arranged in the direction of the winding axis WA (direction along the winding axis WA) while having their first ends disposed on the left of the coil core 5 (corresponding to "one side of the winding axis" of the present disclosure) and having their second ends disposed on the right of the coil core 5 (corresponding to "another side of the winding axis" of the present disclosure). Here, the inner-winding upper wiring boards 8a are disposed in the same plane.

The inner-winding lower wiring boards 8b are disposed below the coil core 5 (corresponding to "a second side of the winding axis in the direction perpendicular to the main surface" of the present disclosure) to form multiple pairs with the respective inner-winding upper wiring boards 8a. As in the case of the inner-winding upper wiring boards 8a, when viewed in a plan view, the inner-winding lower wiring boards 8b are arranged in the direction of the winding axis WA while having their first ends disposed on the left of the coil core 5 and their second ends disposed on the right of the coil core 5. Here, the inner-winding lower wiring boards 8b are disposed in the same plane.

Each inner-winding left metal pin 7a connects first ends of a pair of one inner-winding upper wiring board 8a and a corresponding inner-winding lower wiring board 8b. In this embodiment, each inner-winding left metal pin 7a is cylindrical and disposed to have its longitudinal direction extending substantially perpendicularly to the main surface of the resin layer 3. Each inner-winding left metal pin 7a has its upper end surface connected to a corresponding one of the inner-winding upper wiring boards 8a, and has its lower end surface connected to a corresponding one of the inner-winding lower wiring boards 8b. When viewed in a plan view, the inner-winding left metal pins 7a are arranged on the left of the coil core 5 in a direction substantially parallel to the winding axis WA.

Each inner-winding right metal pin 7b connects a second end of one inner-winding upper wiring board 8a to a second end of the inner-winding lower wiring board 8b adjacent to the inner-winding lower wiring board 8b paired with the inner-winding upper wiring board 8a. In this embodiment, as in the inner-winding left metal pin 7a, each inner-winding right metal pin 7b is cylindrical and has its longitudinal direction extending in a direction substantially perpendicular to the main surface of the resin layer 3. Each inner-winding right metal pin 7b has its upper end surface connected to a corresponding inner-winding upper wiring board 8a, and has its lower end surface connected to a corresponding one of the inner-winding lower wiring boards 8b. When viewed in a plan view, each inner-winding right metal pin 7b is disposed on the right of the coil core 5 to extend in a direction substantially parallel to the winding axis WA. The structure with these components forms the inner winding portion 6a of the inductor electrode 6, helically wound around the coil core 5.

As illustrated in FIG. 2, the outer winding portion 6b of the inductor electrode 6 includes multiple outer-winding upper wiring boards 8c (corresponding to "third metal boards" of the present disclosure), multiple outer-winding lower wiring boards 8d (corresponding to "fourth metal boards" of the present disclosure), multiple outer-winding left metal pins 7c (corresponding to "third metal pins" of the present disclosure), and multiple outer-winding right metal pins 7d (corresponding to "fourth metal pins" of the present disclosure).

Each outer-winding upper wiring board 8c is disposed above the coil core 5 and spaced apart from the coil core 5 further than the inner-winding upper wiring boards 8a. When viewed in a plan view, each outer-winding upper wiring board 8c has its first end disposed on the left of the coil core 5 and its second end disposed on the right of the coil core 5. The outer-winding upper wiring boards 8c are arranged in the direction of the winding axis WA. Here, the outer-winding upper wiring boards 8c are arranged in the same plane.

The outer-winding lower wiring boards 8d are disposed below the coil core 5 and spaced apart from the coil core 5 further than the inner-winding lower wiring boards 8b to form multiple pairs with the corresponding outer-winding upper wiring boards 8c. As in the case of the outer-winding upper wiring boards 8c, when viewed in a plan view, each outer-winding lower wiring board 8d has its first end disposed on the left of the coil core 5 and has its second end disposed on the right of the coil core 5. The outer-winding lower wiring boards 8d are arranged in the direction of the winding axis WA. Here, the outer-winding lower wiring boards 8d are arranged in the same plane.

Each outer-winding left metal pin 7c connects first ends of the pair of one outer-winding upper wiring board 8c and the corresponding outer-winding lower wiring board 8d. Each outer-winding left metal pin 7c is cylindrical and has its longitudinal direction extending in a direction substantially perpendicular to the main surface of the resin layer 3. Each outer-winding left metal pin 7c has its upper end surface connected to a corresponding outer-winding upper wiring board 8c and has its lower end surface connected to a corresponding outer-winding lower wiring board 8d. When viewed in a plan view, the outer-winding left metal pins 7c are disposed on the left of the coil core 5 and spaced apart from the coil core 5 further than the inner-winding left metal pins 7a, and arranged in a direction substantially parallel to the winding axis WA.

Each outer-winding right metal pin 7d connects a second end of one outer-winding upper wiring board 8c to a second end of an outer-winding lower wiring board 8d adjacent to the outer-winding lower wiring board 8d paired with the outer-winding upper wiring board 8c. As in the case of the metal pins 7a to 7c, each outer-winding right metal pin 7d is cylindrical and has its longitudinal direction extending in a direction substantially perpendicular to the main surface of the resin layer 3. Each outer-winding right metal pin 7d has its upper end surface connected to a corresponding outer-winding upper wiring board 8c and has its lower end surface connected to a corresponding outer-winding lower wiring board 8d. When viewed in a plan view, the outer-winding right metal pins 7d are disposed on the right of the coil core 5 and spaced apart from the coil core 5 further than the inner-winding right metal pins 7b, and arranged in a direction substantially parallel to the winding axis WA. These components form the outer winding portion 6b of the inductor electrode 6, which is helically wound around the coil core 5 at the outer periphery of the inner winding portion 6a.

The inductor electrode 6 includes, besides the inner winding portion 6a and the outer winding portion 6b, an input metal pin 7g (corresponding to "a fifth metal pin" of the present disclosure) forming an input terminal, and an output metal pin 7h (corresponding to "a fifth metal pin" of the present disclosure) forming an output terminal, a connection wiring board 8e, a connection metal pin 7e, and an inside-outside connection metal pin 7f. Here, these components are described in accordance with the flow of the electric current through the inductor electrode 6. First, the input metal pin 7h has its lower end surface exposed from the lower surface 3b of the resin layer 3 to be connected to the connection electrode of the circuit board 2, and has its upper end surface connected to a first end portion of the connection wiring board 8e disposed in the same plane as the outer-winding upper wiring boards 8c. The second end portion of the connection wiring board 8e is connected, via the connection metal pin 7e, to the inner-winding upper wiring board 8a forming the first end portion of the inner winding portion 6a. Specifically, the electric current inputted from the circuit board 2 sequentially flows through the input metal pin 7g, the connection wiring board 8e, and the connection metal pin 7e, and to the first end portion of the inner winding portion 6a. Subsequently, the inner-winding lower wiring board 8b forming the second end portion of the inner winding portion 6a is connected via the inside-outside connection metal pin 7f to the outer-winding upper wiring board 8c forming the first end portion of the outer winding portion 6b. The second end portion (outer-winding upper wiring board 8c) of the outer winding portion 6b is connected to the upper end surface of the output metal pin 7h. Specifically, the electric current outputted from the second end of the inner winding portion 6b is inputted to the first end portion of the outer winding portion 6b through the inside-outside connection metal pin 7f, and the electric current outputted from the second end portion of the outer winding portion 6b is outputted to the circuit board 2 from the lower end surface of the output metal pin 7h exposed from the lower surface 3b of the resin layer 3. In this embodiment, the input metal pin 7g and the output metal pin 7h have substantially the same length, and are longer than the other metal pins 7a to 7f.

In the above-described electric current flow, when viewed in a plan view, the electric current flows through the inner-winding upper wiring boards 8a and the outer-winding upper wiring boards 8c from the left to the right of the coil core 5, and flows through the inner-winding lower wiring boards 8b and the outer-winding lower wiring board 8d from the right to the left of the coil core 5. When a coil pattern is two-dimensionally disposed on the upper surface 2a of the circuit board 2, the winding axis WA of the coil extends in a direction perpendicular to the upper surface 2a of the circuit board 2. In this embodiment, the wiring structure of the inductor electrode 6 has a three-dimensional structure, so that the winding axis WA of the coil (inductor electrode 6) extends in a direction substantially parallel to the upper surface 2a of the circuit board 2.

The wiring boards 8a to 8e can be formed by, for example, processing a metal board generally used for wiring patterns made of Cu, Al, Ag, Ni, or other metals into an intended pattern by etching, punching, or other processing. The metal pins 7a to 7h can be formed by, for example, cutting metal or alloy wires generally used for wiring patterns made of Cu, Al, Ag, Ni, or other metals or an alloy of these.

An insulating film made of an insulating material such as epoxy resin, polyimide, or silicone resin may be disposed between the coil core 5 and the wiring boards 8a and 8b of the inner winding portion 6a. The structure with an insulating film ensures the insulation between the coil core 5 and the inductor electrode 6, and thus stabilizes the characteristics of the inductor electrode 6.

(Method for Manufacturing Inductor)

With reference to FIG. 3A to FIG. 6E, a method for manufacturing the inductor 1a is described. Each of FIGS. 3A to 3D is a plan view of the wiring boards 8a to 8e supported by frames 10a to 10d. FIG. 4A to FIG. 6E illustrate a method for manufacturing the inductor 1a. FIG. 4A and FIG. 5A are plan views of etching plates 9a and 9b, and FIG. 4B and FIG. 5B are diagrams of the etching plates 9a and 9b viewed in a direction parallel to the main surface of the etching plates 9a and 9b.

The wiring boards 8a to 8e are prepared, first. The wiring boards 8a to 8e can be formed by etching a single metal board (rectangular in a plan view) made of, for example, Cu. For a first etching plate 9a (corresponding to "a first plate" in the present disclosure) in which the outer-winding upper wiring boards 8c and the connection wiring board 8e are to be formed, the area of the first etching plate 9a except for the areas for the frame 10a (corresponding to "a flat frame" of the present disclosure), the outer-winding upper wiring boards 8c, and the connection wiring board 8e is removed by etching to form the first etching plate 9a, in which the outer-winding upper wiring boards 8c and the connection wiring board 8e are supported by the frame 10a at their both ends (see FIG. 3A). In this case, the wiring boards 8c and 8e each have one or more elongations 11a extending from the first end or both ends toward the frame 10a. The wiring boards 8c and 8e are thus supported by the frame 10a with the elongations 11a interposed therebetween. The elongations 11a have a smaller wire width than the wiring boards 8c and 8e.

In the same manner as the first etching plate 9a, prepared are a second etching plate 9b (see FIG. 3B) having the inner-winding upper wiring boards 8a supported by a frame 10b with elongations 11b interposed therebetween, a third etching plate 9c (see FIG. 3C) having the inner-winding lower wiring boards 8b supported by a frame 10c with elongations 11c interposed therebetween, and a fourth etching plate 9d (see FIG. 3D) having the outer-winding lower wiring boards 8d supported by the frame 10d with elongations 11d interposed therebetween. Here, the second etching plate 9b corresponds to "a second plate" of the present disclosure, the third etching plate 9c corresponds to "a third plate" of the present disclosure, and the fourth etching plate 9d corresponds to "a fourth plate" of the present disclosure.

As illustrated in FIG. 4A, first ends (upper end surfaces) of the metal pins 7c to 7h are then connected to the predetermined portions of the first main surface of the first etching plate 9a. In this case, the first etching plate 9a is connected to the metal pins 7c to 7h at the lower surfaces of the wiring boards 8c and 8e. Thus, the metal pins 7c to 7h are vertically arranged on the first main surface of the first etching plate 9a to form a first structure 12a (see FIG. 4B). Here, the wiring boards 8c and 8e and the metal pins 7c to 7h are connected together by, for example, ultrasonic bonding or bonding with a bonding agent such as solder, conductive paste, or an anisotropic conductive adhesive.

Subsequently, as illustrated in FIG. 5A, in the same manner as the first structure 12a, a second structure 12b is formed in which the inner-winding left metal pins 7a and the inner-winding right metal pins 7b are vertically arranged on the first main surface of the second etching plate 9b (see FIG. 5B). Here, the first structure 12a and the second structure 12b may be manufactured in the opposite order.

Subsequently, as illustrated in FIG. 6A, the lower end surface of the connection metal pin 7e of the first structure 12a is connected to an end portion of the inner-winding upper wiring board 8a forming the first end portion of the inner winding portion 6a. Subsequently, the coil core 5 is placed to face the lower surface of the second etching plate 9b between the row of the inner-winding left metal pins 7a and the row of the inner-winding right metal pins 7b. Subsequently, the lower end surfaces of the inner-winding left metal pins 7a and the inner-winding right metal pins 7b are connected to the predetermined portions of the upper surface of the inner-winding lower wiring boards 8b, and the lower end surface of the inside-outside connection metal pin 7f is connected to an end portion of the inner-winding lower wiring board 8b (upper surface at the left end portion) forming the second end portion of the inner winding portion 6a. Subsequently, the lower end surfaces of the outer-winding left metal pins 7c and the outer-winding right metal pins 7d are connected to the upper surfaces of the outer-winding lower wiring boards 8d to form a third structure 12c (see FIG. 6B). Thus, the inductor electrode 6 wound around the coil core 5 is complete. In the state of the second structure 12b, after the coil core 5 is placed, the lower end surfaces of the inner-winding left metal pins 7a and the inner right metal pins 7b may be connected to the third etching plate 9c to complete the inner winding portion 6a, and then the resultant structure may be connected to the first structure 12a to complete the inductor electrode 6.

Subsequently, as illustrated in FIG. 6C, the lower end surfaces of the input metal pin 7g and the output metal pin 7h of the inductor electrode 6 are connected to the upper surface 2a of the circuit board 2 on which the components 4 are mounted to form a fourth structure 12d. These metal pins 7g and 7h and the circuit board 2 may be connected together by, for example, soldering. The components 4 are mounted on the circuit board 2 by a known surface mount technology.

As illustrated in FIG. 6D, subsequently, a space between the first etching plate 9a and the circuit board 2 is filled with, for example, epoxy resin to form a resin layer 3 (fifth structure 12e).

Subsequently, as illustrated in FIG. 6E, the frames 10a to 10d of the etching plates 9a to 9d are removed to complete the inductor 1a. The frames 10a to 10d are removed by, for example, dicing. Thus, the first ends of the elongations 11a to 11d reach the periphery of the resin layer 3 when viewed in a plan view, and are exposed from the side surfaces 3c of the resin layer 3.

According to the above embodiment, the inductor electrode 6 thus includes the metal pins 7a to 7h and the wiring boards 8a to 8d, which have lower specific resistance than the conductive paste or plating. Thus, the inductor electrode 6 as a whole can reduce its resistance. The inductor 1a can thus improve its characteristics (such as inductance). The inductor electrode 6 has a three-dimensional wiring structure (multiplex winding structure) including the inner winding portion 6a and the outer winding portion 6b. Thus, the inductor electrode 6 can easily have more windings than in the case, for example, where the inner-winding upper wiring boards 8a and the outer-winding upper wiring boards 8c are disposed in the same plane. Specifically, this structure enables the provision of the inductor 1a that is small-sized and has desired characteristics (such as inductance). The inductor 1a with this structure can be manufactured at low costs without the need for forming through hole conductors or via conductors included in an existing structure.

The input metal pin 7g and the output metal pin 7h are longer than the other metal pins 7a to 7f. Thus, spaces for allowing the component 4 formed therein can be formed between the fourth etching plate 9d and the circuit board 2. This structure can thus improve the flexibility for designing the inside of the resin layer 3. As described in the above embodiment, the inductor electrode 6 and the components 4 can be three-dimensionally disposed, so that the size reduction of the inductor 1a can be facilitated.

When the inductor 1a is mounted on the mother board, the components 4 can be located near the mother board. This structure enhances the dissipation of the heat from the components 4.

The outer-winding left metal pins 7c are spaced apart from the coil core 5 further than the inner-winding left metal pins 7a, and the outer-winding right metal pins 7d are spaced apart from the coil core 5 further than the inner-winding right metal pins 7b. This structure prevents the metal pins 7c and 7d constituting a part of the outer winding portion 6b from interfering with the winding of the inner winding portion 6a.

The electric current flowing through the inner-winding upper wiring boards 8a and the outer-winding upper wiring boards 8c flows from the left to the right of the coil core 5, and the electric current flowing through the inner-winding lower wiring boards 8b and the outer-winding lower wiring boards 8d flows from the right to the left of the coil core 5. While electric current is flowing through the inductor electrode 6, this structure prevents the magnetic field generated in the inner winding portion 6a and the magnetic field generated in the outer winding portion 6b from cancelling each other. This structure can thus improve the characteristics such as inductance.

The existence of the elongations 11a to 11d included in the wiring boards 8a to 8e increases the metal areas in the inductor 1a, and improves heat dissipation of the inductor 1a. The end portions of the elongations 11a to 11d are exposed from the side surfaces 3c of the resin layer 3, and thus facilitate the dissipation of the heat stored in the resin layer 3.

<Second Embodiment>

An inductor according to a second embodiment of the present disclosure is described with reference to FIG. 7. FIG. 7 illustrates an inductor of the second embodiment and corresponds to FIG. 1.

An inductor 1b according to the present embodiment differs from the inductor 1a according to the first embodiment described with reference to FIG. 1 in that, as illustrated in FIG. 7, main surfaces 2a and 2b of the circuit board 2 have smaller areas, the side surfaces of the circuit board 2 are covered with the resin layer 3, and the lower end surfaces of the input metal pin 7g and the output metal pin 7h are exposed from the lower surface 3b of the resin layer 3. Other components are the same as those of the inductor 1a according to the first embodiment, and thus are denoted with the same reference signs and not described.

Besides the effects of the first embodiment, this structure allows the inductor electrode 6 to be directly connected to the mother board.

<Third Embodiment>

An inductor according to a third embodiment of the present disclosure is described with reference to FIG. 8 and FIGS. 9A to 9D. FIG. 8 illustrates an inductor according to this embodiment, and corresponds to FIG. 1. FIGS. 9A to 9D include plan views of wiring boards supported by frames, and correspond to FIGS. 3A to 3D.

An inductor 1c according to the present embodiment differs from the inductor 1a according to the first embodiment described with reference to FIG. 1 in that, as illustrated in FIG. 8, an inductor electrode 60 has a different structure, the components 4 are disposed at different positions, and a support plate 13 is additionally included. Other components are the same as those of the inductor 1a according to the first embodiment, and thus are denoted with the same reference signs and not described.

Here, the metal pins 7a to 7h constituting a part of the inductor electrode 60 have the same length and the same thickness, and have their upper end surfaces connected to a lower surface 13a of the support plate 13. Insertion holes 14a and 14c are formed at the left end portions of the outer-winding upper wiring boards 8c to be electrically connected to the outer-winding left metal pins 7c (or input metal pin 7g). Insertion holes 14a and 14d are formed at right end portions of the outer-winding upper wiring boards 8c to be electrically connected to the outer-winding right metal pins 7d (or inside-outside connection metal pin 7f) (see FIG. 9A). Here, the insertion holes 14a to 14d have a diameter slightly smaller than the diameter (cross-sectional area taken perpendicularly to the longitudinal direction) of the metal pins 7c, 7d, 7f, and 7g that are connected to thereto. When the metal pins 7c, 7d, 7f, and 7g are inserted into the insertion holes 14a to 14d, portions of the peripheral surfaces of the metal pins 7c, 7d, 7f, and 7g come into contact with and are electrically connected to the peripheral surfaces of the insertion holes 14a, 14b, and 14c, and the wiring boards 8c are supported by the metal pins 7c, 7d, 7f, and 7g.

The metal pins 7a and 7b of the inner winding portion 6a have a length long enough to extend through and reach the wiring boards 8c and 8d of the outer winding portion 6b. Each wiring board 8c has one or more insertion holes 15a, which have a greater diameter than the metal pins 7a and 7b, at positions overlapping the inner-winding left metal pins 7a and the inner-winding right metal pins 7b when viewed in a plan view. These insertion holes 15a allow the metal pins 7a and 7b to extend through the wiring boards 8c without the inner-winding left metal pins 7a or the inner-winding right metal pins 7b coming in contact with the wiring boards 8c (see FIG. 11A). In the following, insertion holes having a smaller diameter for electrical conduction with the metal pins may be referred to as electrically conductive insertion holes, and insertion holes having a larger diameter for preventing contact with the metal pins may be referred to as contact prevention insertion holes.

As illustrated in FIG. 9B, electrically conductive insertion holes 14e for the inner-winding left metal pins 7a are formed at the left end portions of the respective inner-winding upper wiring boards 8a. Electrically conductive insertion holes 14f and 14g for the inner-winding right metal pins 7b or the output metal pin 7h are formed at the right end portions of the respective inner-winding upper wiring boards 8a.

As illustrated in FIG. 9C, electrically conductive insertion holes 14h for the inner-winding left metal pins 7a are formed at the left end portions of the inner-winding lower wiring boards 8b. Electrically conductive insertion holes 14i and 14j for the inner-winding right metal pins 7b or the inside-outside connection metal pin 7f are formed at the right end portions of the inner-winding lower wiring boards 8b.

As illustrated in FIG. 9D, electrically conductive insertion holes 14k for the outer-winding left metal pins 7c are formed at the left end portions of the outer-winding lower wiring boards 8d. Electrically conductive insertion holes 14m for the outer-winding right metal pins 7d are formed at the right end portions of the outer-winding lower wiring boards 8d. Contact prevention insertion holes 15b are formed in the outer-winding lower wiring boards 8d at portions overlapping the inner-winding left metal pins 7a and the inner-winding right metal pin 7b when viewed in a plan view. The contact prevention insertion holes may be cuts that can prevent the contact.

The flow of the electric current through the inductor electrode 60 is described with reference to FIGS. 9A to 9D. First, the electric current inputted from the lower end surface of the input metal pin 7g is inputted to the first end portion of the outer winding portion 6b at the position of the electrically conductive insertion hole 14c (see FIG. 9A), and flows to the second end portion of the outer winding portion 6b. The electrically conductive insertion hole 14d located at the second end portion of the outer winding portion 6b and the electrically conductive insertion hole 14j located at the first end portion of the inner winding portion 6a are connected together with the inside-outside connection metal pin 7f being inserted thereinto (see FIG. 9A and FIG. 9C). Thus, the electric current outputted from the second end portion of the outer winding portion 6b flows through the inside-outside connection metal pin 7f and is inputted to the first end portion of the inner winding portion 6a. An electrically conductive insertion hole 14g (see FIG. 9B) for the output metal pin 7h is formed at the second end portion of the inner winding portion 6a, and the electric current outputted from the second end portion of the inner winding portion 6a is outputted from the lower end surface of the output metal pin 7h.

(Method for Manufacturing Inductor 1c)

Subsequently, a method for manufacturing the inductor 1c is described with reference to FIG. 9A to FIG. 11D. Each of FIGS. 10A to 10E illustrates processes of a method for manufacturing the inductor 1c, and each of FIGS. 11A to 11D illustrates the positional relationship between the metal pins and the wiring boards while the metal pins extend through the wiring boards.

As illustrated in FIG. 10A, the upper end surfaces of the metal pins 7a, 7b, 7c, 7d, 7f, 7g, and 7h are connected to the predetermined portions of the lower surface 13a of the support plate 13 to allow the metal pins 7a to 7h to be vertically arranged on the lower surface 13a of the support plate 13. The support plate 13 may be made of, for example, resin. The metal pins 7a to 7h may be fixed by, for example, fitting the metal pins 7a, 7b, 7c, 7d, 7f, 7g, and 7h into multiple fit recesses to fix the metal pins at the predetermined portions of the lower surface 13a of the support plate 13, by attaching an adhesive sheet to the lower surface 13a of the support plate 13, or by soldering. The metal pins 7a, 7b, 7c, 7d, 7f, 7g, and 7h having the same length can be more easily vertically arranged on the support plate 13 compared to the case where they have different lengths.

Subsequently, the metal pins 7a, 7b, 7c, 7d, 7f, 7g, and 7h are inserted into the corresponding electrically conductive insertion holes 14a to 14d and the corresponding contact prevention insertion holes 15a formed in the outer-winding upper wiring boards 8c of the first etching plate 9a. At this time, as illustrated in FIG. 11A, the electrically conductive insertion holes 14a to 14d have a diameter slightly smaller than the metal pins 7c, 7d, 7f, and 7g inserted therethrough. Thus, the metal pins 7c, 7d, 7f, and 7g and the electrically conductive insertion holes 14a to 14d allow electric current to pass therebetween without having a gap therebetween. The first etching plate 9a is fixed when the electrically conductive insertion holes 14a to 14d and the metal pins 7c, 7d, 7f, and 7g fit to each other. The metal pins 7a and 7b constituting the inner winding portion 6a that do not require electrical conduction with the outer-winding upper wiring boards 8c extend through the contact prevention insertion holes 15a. The contact prevention insertion holes 15a having a larger diameter have gaps between themselves and the peripheral surfaces of the metal pins 7a and 7b inserted thereinto.

Subsequently, in the same manner, the electrically conductive insertion holes 14e to 14g formed in the inner-winding upper wiring boards 8a of the second etching plate 9b allow the corresponding metal pins 7a, 7b, and 7h to be inserted thereinto. As this time, the electrically conductive insertion holes 14e to 14g do not have a gap between themselves and the peripheral surfaces of the metal pins 7a, 7b, and 7h. Thus, the electrically conductive insertion holes 14e to 14g and the metal pins 7a, 7b, and 7h inserted thereinto allow electric current to pass therebetween (see FIG. 11B). The second etching plate 9b is fixed when these electrically conductive insertion holes 14e to 14g and the metal pins 7a, 7b, and 7h fit to each other.

Subsequently, the coil core 5 is placed between the row of the inner-winding left metal pins 7a and the row of the inner-winding right metal pins 7b. Thereafter, the third etching plate 9c and the fourth etching plate 9d are fixed in this order in the same manner to complete the inductor electrode 60 (see FIG. 11C and FIG. 11D). Here, as illustrated in FIG. 10B, the etching plates 9a to 9d are arranged and fixed at predetermined intervals and substantially parallel to each other.

Subsequently, as illustrated in FIG. 10C, the lower end surfaces of the metal pins 7a, 7b, 7c, 7d, 7f, 7g, and 7h are connected with solder to the upper surface 2a of the circuit board 2. Here, the components 4 are mounted in advance on the circuit board 2 with a known surface mount technology.

Subsequently, as illustrated in FIG. 10D, a space between the support plate 13 and the circuit board 2 is filled with, for example, epoxy resin to form the resin layer 3 that seals the etching plates 9a to 9d and the metal pins 7a, 7b, 7c, 7d, 7f, 7g, and 7h therein.

Subsequently, as illustrated in FIG. 10E, the frames 10a to 10d of the etching plates 9a to 9d are removed to complete the inductor 1c. The frames 10a to 10d can be removed by, for example, dicing or laser processing. Removal of the frames 10a to 10d exposes the end portions of the elongations 11a to 11d of the wiring boards 8a to 8d from the side surfaces 3c of the resin layer 3.

According to the present embodiment, the contact prevention insertion holes 15a and 15b are formed in the outer-winding upper wiring boards 8c and the outer-winding lower wiring boards 8d. This structure enables the formation of the inductor electrode 60 of a multiplex winding structure without changing the length of the metal pins 7a, 7b, 7c, 7d, 7f, 7g, and 7h. Using the metal pins with the same length and thickness enables reduction of manufacturing costs for the inductor 1c. Simply inserting the metal pins 7a, 7b, 7c, 7d, 7f, 7g, and 7h into the predetermined electrically conductive insertion holes 14a to 14k and 14m enables electrical conduction of necessary portions and fixing of the wiring boards 8a to 8d. This structure is thus advantageous in manufacturing costs.

<Fourth Embodiment>

An inductor according to a fourth embodiment of the present disclosure is described with reference to FIG. 12. FIG. 12 illustrates an inductor according to the present embodiment and corresponds to FIG. 8.

An inductor 1d according to the present embodiment differs from the inductor 1c according to the third embodiment described with reference to FIG. 8 in that, as illustrated in FIG. 12, multiple metal pins constituting a part of the inductor electrode 60 include those having different lengths. Other components are the same as those of the inductor 1c according to the third embodiment, and thus are denoted with the same reference signs and not described.

In this case, each inner-winding left metal pin 7a, each inner-winding right metal pin 7b, each outer-winding left metal pin 7c, each outer-winding right metal pin 7d, and each inside-outside connection metal pin 7f have the same length. The input metal pin 7g and the output metal pin 7h are longer than the metal pins 7a, 7b, 7c, 7d, and 7f. The inductor 1d can be manufactured in the same manner as in the case of the inductor 1c according to the third embodiment.

Besides the effects of the inductor 1c according to the third embodiment, this structure improves the flexibility of the arrangement of the components 4 mounted on the upper surface 2a of the circuit board 2 and the flexibility of designing wiring patterns formed on the upper surface 2a.

<Fifth Embodiment>

An inductor according to a fifth embodiment of the present disclosure is described with reference to FIG. 13. FIG. 13 illustrates an inductor according to the present embodiment and corresponds to FIG. 8.

An inductor 1e according to the present embodiment differs from the inductor 1c according to the third embodiment described with reference to FIG. 8 in that, as illustrated in FIG. 13, the main surfaces 2a and 2b of the circuit board 2 have a smaller area, the side surfaces of the circuit board 2 are covered with the resin layer 3, the lower end surfaces of the input metal pin 7g and the output metal pin 7h are exposed from the lower surface 3b of the resin layer 3, and components are not disposed on the circuit board 2. Other components are the same as those of the inductor 1c according to the third embodiment, and thus are denoted with the same reference signs and not described.

Besides the effects of the third embodiment, this structure enables the direct connection of the inductor electrode 60 to the mother board. In addition, the inductor 1e can have a lower height due to exclusion of the components.

The present disclosure is not limited to the above-described embodiments, and may be changed in various different manners without departing from the scope of the disclosure. For example, each of the above-described embodiments has described the case where the coil core 5 is disposed on the winding axis WA of the inductor electrode 6 or 60. However, the coil core 5 is not necessarily provided. In this case, for example, the inductor electrode 6 or 60 may be used as an antenna coil. When, for example, a spiral coil pattern (antenna coil) is disposed on the first main surface of the circuit board 2 and a component is disposed at the center of the spiral, the magnetic flux extends in a direction perpendicular to the main surface of the circuit board on the center of the spiral. Thus, the component blocks the magnetic flux and may degrade the sensitivity of the antenna. On the other hand, the inductor electrode 6 or 60 having a three-dimensional structure, as in this embodiment, can keep each component 4 away from the winding axis WA (center) of the inductor electrode 6 or 60, and can thus improve the antenna sensitivity.

The above-described embodiments have described the case where the metal pins 7a to 7h are cylindrical. However, the metal pins 7a to 7h may have, for example, a prism shape having a rectangular cross section taken in the direction perpendicular to the longitudinal direction.

Any of the structures of the inductors 1a to 1e according to the embodiments may be combined.

The present disclosure is widely applicable to various types of inductors including an inductor electrode including metal pins and wiring metal boards.

1a to 1e inductor
2 circuit board
3 resin layer
4 component
5 coil core
6, 60 inductor electrode
6a inner winding portion
6b outer winding portion
7a inner-winding left metal pin (first metal pin)
7b inner-winding right metal pin (second metal pin)
7c outer-winding left metal pin (third metal pin)
7d outer-winding right metal pin (fourth metal pin)
7g input metal pin (fifth metal pin)
7h output metal pin (fifth metal pin)
8a inner-winding upper wiring board (first metal board)
8b inner-winding lower wiring board (second metal board)
8c outer-winding upper wiring board (third metal board)
8d outer-winding lower wiring board (fourth metal board)
9a first etching plate (first plate)
9b second etching plate (second plate)
9c third etching plate (third plate)
9d fourth etching plate (fourth plate)
10a to 10d frame (flat frame)
11a to 11d elongation
13 support plate
14a to 14k, 14m insertion hole (insertion hole with small diameter)
15a, 15b insertion hole (contact prevention insertion hole, insertion hole with large diameter)
WA winding axis

The invention claimed is:

1. An inductor, comprising:
a resin layer having a main surface; and
an inductor electrode wound around a winding axis set in the resin layer,
wherein the inductor electrode includes an inner winding portion and an outer winding portion,
wherein the inner winding portion includes
  a plurality of wiring first metal boards having first ends disposed at one side of the winding axis and second ends disposed at another side of the winding axis when viewed in a direction perpendicular to the main surface, the plurality of wiring first metal boards being arranged in a winding axis direction at a first side of the winding axis in the direction perpendicular to the main surface,
  a plurality of wiring second metal boards having first ends disposed at one side of the winding axis and second ends disposed at another side of the winding axis when viewed in the direction perpendicular to the main surface, the plurality of wiring second metal boards being arranged in the winding axis direction at a second side of the winding axis in the direction perpendicular to the main surface to form a plurality of pairs with the respective first metal boards,
  a plurality of first metal pins connecting the first ends of the first metal boards to the first ends of the second metal boards paired with the first metal boards, and
  a plurality of second metal pins each connecting the second end of one of the first metal boards to the second end of one of the second metal boards adjacent to the second metal board paired with the first metal board,
wherein the outer winding portion includes
  a plurality of wiring third metal boards having first ends disposed at one side of the winding axis and second ends disposed at another side of the winding axis when viewed in the direction perpendicular to the main surface, the plurality of wiring third metal boards being arranged in the winding axis direction at the first side of the winding axis in the direction perpendicular to the main surface and at positions apart from the winding axis further than the first metal boards,
  a plurality of wiring fourth metal boards having first ends disposed at one side of the winding axis and second ends disposed at another side of the winding axis when viewed in the direction perpendicular to the main surface, the plurality of wiring fourth metal boards being arranged in the winding axis direction at the second side of the winding axis in the direction perpendicular to the main surface and at positions apart from the winding axis further than the second metal boards to form a plurality of pairs with the respective third metal boards,
  a plurality of third metal pins connecting the first ends of the third metal boards to the first ends of the fourth metal boards paired with the third metal boards, and
  a plurality of fourth metal pins each connecting the second end of one of the third metal boards to the second end of one of the fourth metal boards adjacent to the fourth metal board paired with the third metal board,
wherein the first metal pins and the second metal pins extend through the first metal boards and the second metal boards to which the first and second metal pins are connected, and have a length reaching the third metal boards and the fourth metal boards, and
wherein the third metal boards and the fourth metal boards have insertion holes for prevention of contact with the first metal pins and the second metal pins.

2. The inductors according to claim 1
wherein the first metal pins, the second metal pins, the third metal pins, and the fourth metal pins have a same length.

3. The inductor according to claim 1,
wherein the inductor electrode further includes a fifth metal pin serving as an input terminal or an output terminal, and
wherein the fifth metal pin is longer than each of the first metal pins, the second metal pins, the third metal pins, and the fourth metal pins.

4. The inductor according to claim 3, further comprising:
a circuit board having a first main surface in contact with the main surface of the resin layer; and
a component mounted on the first main surface and sealed in the resin layer, wherein a first end of the fifth metal pin is exposed from the main surface of the resin layer and connected to the circuit board.

5. The inductor according to claim 1,
wherein, when viewed in the direction perpendicular to the main surface, the third metal pins are arranged along the winding axis at positions apart from the winding axis further than the first metal pins, and
wherein, when viewed in the direction perpendicular to the main surface, the fourth metal pins are arranged along the winding axis at positions apart from the winding axis further than the second metal pins.

6. The inductor according to claim 1,
wherein electric current flowing through the first metal boards and the third metal boards flows from the first ends to the second ends, and
wherein electric current flowing through the second metal boards and the fourth metal boards flows from the second ends to the first ends.

7. The inductor according to claim 1,
wherein the first metal boards, the second metal boards, the third metal boards, and the fourth metal boards each include elongations reaching, when viewed in the direction perpendicular to the main surface, a periphery of the resin layer at the first ends and the second ends.

8. The inductor according to claim 1,
wherein a coil core is disposed on the winding axis.

9. A method for manufacturing the inductor according to claim 1, the method comprising:
a step of fixing first ends of the first metal pins, the second metal pins, the third metal pins, and the fourth metal pins to a first main surface of a support plate to vertically arrange the metal pins on the first main surface of the support plate;
a step of preparing
a first plate including the third metal boards and a flat frame supporting the third metal boards, the third metal boards each having an insertion hole having a diameter smaller than each of diameters of the third metal pins and the fourth metal pins connected to the third metal boards,
a second plate including the first metal boards and a flat frame supporting the first metal boards, the first metal boards each having an insertion hole having a diameter smaller than each of diameters of the first metal pins and the second metal pins connected to the first metal boards,
a third plate including the second metal boards and a flat frame supporting the second metal boards, the second metal boards each having an insertion hole having a diameter smaller than each of diameters of the first metal pins and the second metal pins connected to the second metal boards, and
a fourth plate including the fourth metal boards and a flat frame supporting the fourth metal boards, the fourth metal boards each having an insertion hole having a diameter smaller than each of diameters of the third metal pins and the fourth metal pins connected to the fourth metal boards, and inserting the metal pins into the corresponding insertion holes to arrange and fix the metal pins substantially parallel to each other at predetermined intervals sequentially at the first plate, the second plate, the third plate, and the fourth plate;
a step of sealing the first to fourth metal pins and the first to fourth plates with resin to form a resin layer; and
a step of removing the flat frames of the first to fourth plates by dicing,
wherein the third metal boards and the fourth metal boards have insertion holes having a larger diameter than the metal pins at positions overlapping the first metal pins and the second metal pins when viewed in a direction perpendicular to the first main surface of the support plate.

10. The inductor according to claim 2,
wherein the inductor electrode further includes a fifth metal pin serving as an input terminal or an output terminal, and
wherein the fifth metal pin is longer than each of the first metal pins, the second metal pins, the third metal pins, and the fourth metal pins.

11. The inductor according to claim 2,
wherein, when viewed in the direction perpendicular to the main surface, the third metal pins are arranged along the winding axis at positions apart from the winding axis further than the first metal pins, and
wherein, when viewed in the direction perpendicular to the main surface, the fourth metal pins are arranged along the winding axis at positions apart from the winding axis further than the second metal pins.

12. The inductor according to claim 3,
wherein, when viewed in the direction perpendicular to the main surface, the third metal pins are arranged along the winding axis at positions apart from the winding axis further than the first metal pins, and
wherein, when viewed in the direction perpendicular to the main surface, the fourth metal pins are arranged along the winding axis at positions apart from the winding axis further than the second metal pins.

13. The inductor according to claim 4,
wherein, when viewed in the direction perpendicular to the main surface, the third metal pins are arranged along the winding axis at positions apart from the winding axis further than the first metal pins, and
wherein, when viewed in the direction perpendicular to the main surface, the fourth metal pins are arranged along the winding axis at positions apart from the winding axis further than the second metal pins.

14. The inductor according to claim 2,
wherein electric current flowing through the first metal boards and the third metal boards flows from the first ends to the second ends, and
wherein electric current flowing through the second metal boards and the fourth metal boards flows from the second ends to the first ends.

15. The inductor according to claim 3,
wherein electric current flowing through the first metal boards and the third metal boards flows from the first ends to the second ends, and
wherein electric current flowing through the second metal boards and the fourth metal boards flows from the second ends to the first ends.

16. The inductor according to claim 4,
wherein electric current flowing through the first metal boards and the third metal boards flows from the first ends to the second ends, and
wherein electric current flowing through the second metal boards and the fourth metal boards flows from the second ends to the first ends.

17. An inductor, comprising:
a resin layer having a main surface;
an inductor electrode wound around a winding axis set in the resin layer, wherein the inductor electrode includes an inner winding portion and an outer winding portion, wherein the inner winding portion includes
- a plurality of wiring first metal boards having first ends disposed at one side of the winding axis and second ends disposed at another side of the winding axis when viewed in a direction perpendicular to the main surface, the plurality of wiring first metal boards being arranged in a winding axis direction at a first side of the winding axis in the direction perpendicular to the main surface,
- a plurality of wiring second metal boards having first ends disposed at one side of the winding axis and second ends disposed at another side of the winding axis when viewed in the direction perpendicular to the main surface, the plurality of wiring second metal boards being arranged in the winding axis direction at a second side of the winding axis in the direction perpendicular to the main surface to form a plurality of pairs with the respective first metal boards,
- a plurality of first metal pins connecting the first ends of the first metal boards to the first ends of the second metal boards paired with the first metal boards, and
- a plurality of second metal pins each connecting the second end of one of the first metal boards to the second end of one of the second metal boards adjacent to the second metal board paired with the first metal board, wherein the outer winding portion includes
- a plurality of wiring third metal boards having first ends disposed at one side of the winding axis and second ends disposed at another side of the winding axis when viewed in the direction perpendicular to the main surface, the plurality of wiring third metal boards being arranged in the winding axis direction at the first side of the winding axis in the direction perpendicular to the main surface and at positions apart from the winding axis further than the first metal boards,
- a plurality of wiring fourth metal boards having first ends disposed at one side of the winding axis and second ends disposed at another side of the winding axis when viewed in the direction perpendicular to the main surface, the plurality of wiring fourth metal boards being arranged in the winding axis direction at the second side of the winding axis in the direction perpendicular to the main surface and at positions apart from the winding axis further than the second metal boards to form a plurality of pairs with the respective third metal boards,
- a plurality of third metal pins connecting the first ends of the third metal boards to the first ends of the fourth metal boards paired with the third metal boards, and
- a plurality of fourth metal pins each connecting the second end of one of the third metal boards to the second end of one of the fourth metal boards adjacent to the fourth metal board paired with the third metal board, a fifth metal pin serving as an input terminal or an output terminal wherein the fifth metal pin is longer than each of the first metal pins, the second metal pins, the third metal pins, and the fourth metal pins, a circuit board having a first main surface in contact with the main surface of the resin layer; and a component mounted on the first main surface and sealed in the resin layer, wherein a first end of the fifth metal pin is exposed from the main surface of the resin layer and connected to the circuit board.

18. The inductor according to claim 17, wherein, when viewed in the direction perpendicular to the main surface, the third metal pins are arranged along the winding axis at positions apart from the winding axis further than the first metal pins, and wherein, when viewed in the direction perpendicular to the main surface, the fourth metal pins are arranged along the winding axis at positions apart from the winding axis further than the second metal pins.

19. The inductor according to claim 17, wherein electric current flowing through the first metal boards and the third metal boards flows from the first ends to the second ends, and wherein electric current flowing through the second metal boards and the fourth metal boards flows from the second ends to the first ends.

* * * * *